United States Patent [19]

Kanai et al.

[11] Patent Number: 5,289,049
[45] Date of Patent: Feb. 22, 1994

[54] SIGNAL INPUT SELECTING CIRCUITS

[75] Inventors: Takashi Kanai, Chiba; Kaneaki Fujishita, Kanagawa, both of Japan

[73] Assignee: Sony Corporation, Tokyo, Japan

[21] Appl. No.: 927,583

[22] Filed: Aug. 10, 1992

[30] Foreign Application Priority Data

Aug. 15, 1991 [JP] Japan .................................. 3-204509
Oct. 7, 1991 [JP] Japan .................................. 3-259383

[51] Int. Cl.$^5$ .............................................. H03F 1/00
[52] U.S. Cl. .................................. 307/243; 307/350; 307/355
[58] Field of Search ............... 307/242, 243, 354, 362, 307/350, 355; 328/104, 154

[56] References Cited

U.S. PATENT DOCUMENTS

| | | | |
|---|---|---|---|
| 3,781,912 | 12/1973 | McCollum, Jr. ..................... | 328/104 |
| 3,904,977 | 9/1975 | Barsotti ............................... | 328/154 |
| 4,521,810 | 6/1985 | Nigborowicz et al. ............... | 328/104 |
| 4,766,333 | 8/1988 | Mobley ................................ | 307/355 |
| 4,814,642 | 3/1989 | Kleks ................................... | 307/362 |
| 4,891,807 | 1/1990 | Hutch ................................... | 328/104 |
| 5,045,804 | 9/1991 | Sugawara et al. ................... | 328/154 |
| 5,113,091 | 5/1992 | Hsu et al. ............................. | 307/355 |
| 5,202,589 | 4/1993 | Hüser .................................... | 307/355 |

Primary Examiner—E. Rollins Cross
Assistant Examiner—Thomas Moulis
Attorney, Agent, or Firm—Pasquale Musacchio; Jerry A. Miller

[57] ABSTRACT

A signal input selecting circuit comprises a plurality of signal input terminals, a first switch device for selecting one of signal electrodes of the signal input terminals to be connected with a signal processing block, a second switch device for selecting one of reference electrodes of the signal input terminals to be connected with a reference potential point, a third switch device for connecting the second switch device with a current supplying portion, and a voltage detector for detecting a voltage corresponding to an impedance of the second switch device. When the voltage detected by the voltage detector has a level thereof less than a predetermined level under a condition in which the second switch device is in operation to connect the reference electrode of a selected one of the signal input terminals with the reference potential point and the third switch device is in operation to connect the second switch device with the current supplying portion, the third switch device is turned to disconnect the switch device from the current supplying portion and the first switch device is caused to connect the signal electrode of the selected one of the signal input terminals with the signal processing block.

10 Claims, 4 Drawing Sheets

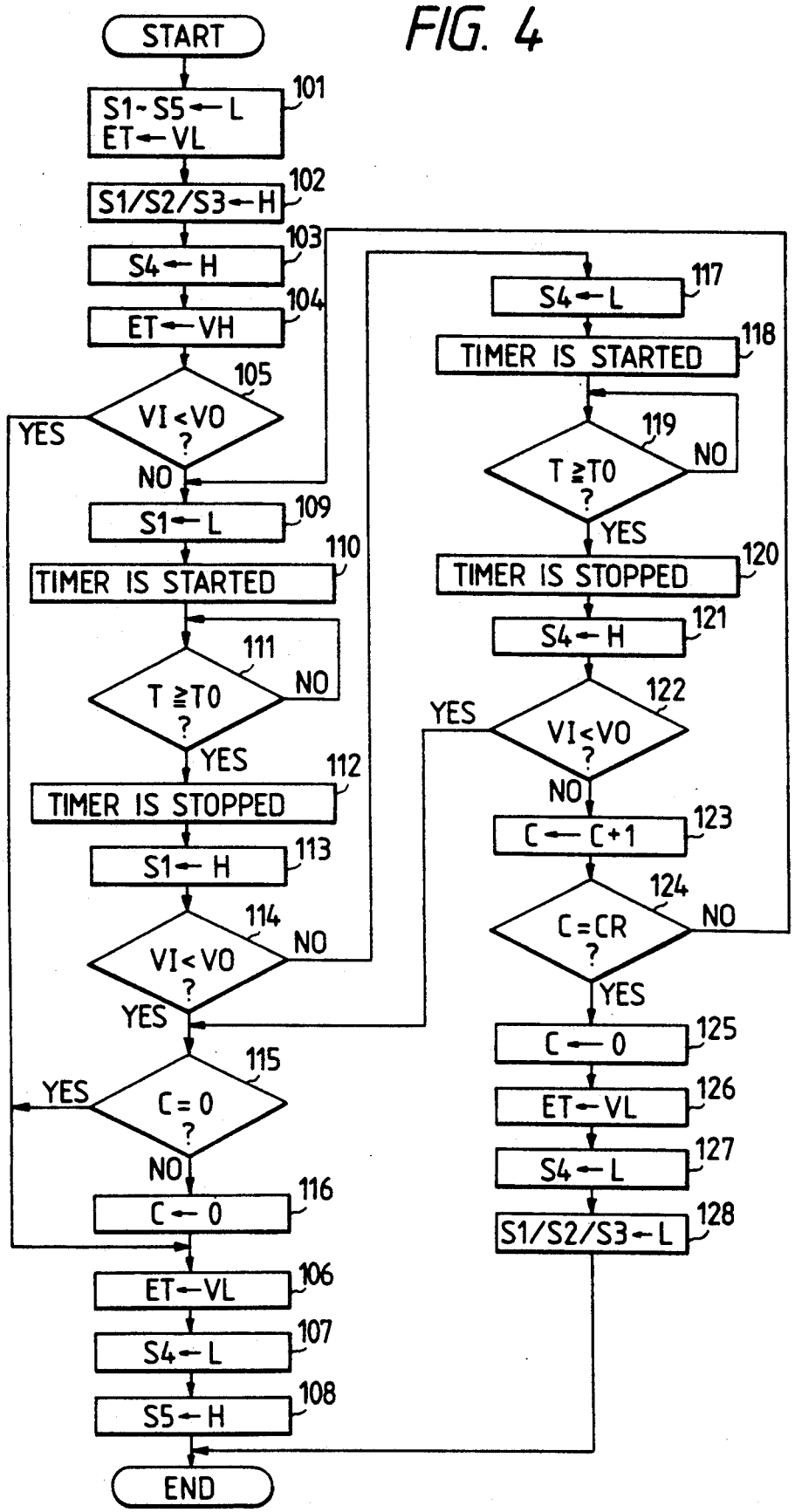

SIGNAL INPUT SELECTING CIRCUITS

BACKGROUND OF THE INVENTION

1. Field of the Invention

The present invention relates generally to signal input selecting circuits, and more particularly, is directed to an improvement in a circuit having a plurality of signal input terminals and operative to select one of a plurality of input signals supplied respectively from a plurality of audio signal producing apparatus which are connected with the signal input terminals, respectively.

2. Description of the Prior Art

In the field of audio apparatus for performing sound reproduction, there has been proposed a sound reproducing system in which a plurality of audio signals generated respectively by a plurality of audio signal producing apparatus including, for example, a tape recorder operating with a pair of independent supply and take-up tape reels, a tape recorder operating with a tape cassette, an audio disc player and so on, are applied respectively to a plurality of external input terminals of an audio amplifier and subjected selectively to amplification by the audio amplifier, and an amplified audio signal obtained from the audio amplifier is applied to a speaker for generating reproduced sound. The audio amplifier which is one of main structural components of the sound reproducing system is disposed so as to have the external input terminals thereof connected to output terminals of the audio signal producing apparatus, respectively, and in operation is operative to select one of the audio signals applied to external input terminals and to amplify the selected audio signals. Therefore, a signal input selecting circuit including the external input terminals is provided in the audio amplifier. A part of a sound reproducing system provided with a typical signal input selecting circuit proposed previously is constituted as shown in FIG. 1. In the part of the sound reproducing system shown in FIG. 1, an audio amplifier 11 having three signal input terminals 12, 13 and 14 is provided. The signal input terminal 12 comprises a signal electrode 12S and a reference electrode 12E, the signal input terminal 13 comprises a signal electrode 13S and a reference electrode 13E, and the signal input terminal 14 comprises a signal electrode 14S and a reference electrode 14E.

The reference electrodes 12E, 13E and 14E constituting the signal input terminal 12, 13, and 14, respectively, are coupled in common with a chassis 15 which is provided with a reference potential in the audio amplifier 11, and the signal electrodes 12S, 13S and 14S constituting the signal input terminals 12, 13 and 14, respectively, are coupled with fixed contacts 20a, 20b and 20c of a switch 20, respectively. A movable contact 20d of the switch 20 is selectively connected to the fixed contacts 20b and 20c and a signal obtained through the movable contact 20d of the switch 20 is supplied to a signal processing block 21 contained in the audio amplifier 11.

In the audio signal reproducing system having such a part as mentioned above, the signal input terminals 12 to 14 and the switch 20 constitute the signal input selecting circuit proposed previously. The chassis 15 is equivalently grounded through a stray capacitor C1.

The signal input terminals 12 to 14 are connected to an output terminal 26 of an audio signal producing apparatus 25, an output terminal 29 of an audio signal producing apparatus 28 and an output terminal 32 of an audio signal producing apparatus 31, respectively. The output terminal 26 of the audio signal producing apparatus 25 comprises a signal electrode 26S and a reference electrode 26E. The signal electrode 26S is coupled with a signal supplying block 27 contained in the audio signal producing apparatus 25 and the reference electrode 26E is coupled with a chassis 34 contained in the audio signal producing apparatus 25. Further, the signal electrode 26S and the reference electrode 26E are connected, through a connecting cable 35, to the signal electrode 12S and the reference electrode 12E of the signal input terminal 12 provided in the audio amplifier 11, respectively.

The output terminal 29 of the audio signal producing apparatus 28 comprises a signal electrode 29S and a reference electrode 29E. The signal electrode 29S and the reference electrode 29E are coupled with a signal supplying block 30 and a chassis 38 contained in the audio signal producing apparatus 28, respectively, and further connected through a connecting cable 36 to the signal electrode 13S and the reference electrode 13E of the signal input terminal 13 provided in the audio amplifier 11, respectively.

Similarly, the output terminal 32 of the audio signal producing apparatus 31 comprises a signal electrode 32S and a reference electrode 32E. The signal electrode 32S and the reference electrode 32E are coupled with a signal supplying block 33 and a chassis 39 contained in the audio signal producing apparatus 31, respectively, and further connected through a connecting cable 37, to the signal electrode 14S and the reference electrode 14E of the signal input terminal 14 provided in the audio amplifier 11, respectively.

With the configuration thus constituted, when the movable contact 20d is connected to the fixed contact 20a in the switch 20, a first operation mode wherein the signal input terminal 12 of the audio amplifier 11 is selected and thereby a signal from the signal supplying block 27 contained in the audio signal producing apparatus 25 is supplied through the output terminal 26 of the audio signal producing apparatus 25, the signal input terminal 12 and the switch 20 in the audio amplifier 11 to the signal processing block 21 contained in the audio amplifier 11 is provided; when the movable contact 20d is connected to the fixed contact 20b in switch 20, a second operation mode wherein the signal input terminal 13 of the audio amplifier 11 is selected and thereby a signal from the signal supplying block 30 contained in the audio signal producing apparatus 28 is supplied through the output terminal 29 of the audio signal producing apparatus 28, the signal input terminal 13 and the switch 20 in the audio amplifier 11 to the signal processing block 21 contained in the audio amplifier 11 is provided; and when the movable contact 20d is connected to the fixed contact 20c in switch 20, a third operation mode wherein the signal input terminal 14 of the audio amplifier 11 is selected and thereby a signal from the signal supplying block 33 contained in the audio signal producing apparatus 31 is supplied through the output terminal 32 of the audio signal producing apparatus 31, the signal input terminal 14 and the switch 20 in the audio amplifier 11 to the signal processing block 21 contained in the audio amplifier 11 is provided.

Under the signal input selecting circuit constituted as described above with the signal input terminals 12 to 14 and the switch 20 is employed in the audio amplifier 11, potential differences between the chassis 15 in the audio amplifier 11 and each of the chassis 34 in the audio signal producing apparatus 25, the chassis 38 in the audio signal producing apparatus 28 and the chassis 39 in the audio signal producing apparatus 31 provide noise sources between the audio amplifier 11 and each of the audio signal producing apparatus 25, 28 and 31. For example, with regard to a combination of the audio amplifier 11 and the audio signal producing apparatus 25, a noise source Sn is equivalently connected through a stray capacitor C2 to the chassis 34 in the audio signal producing apparatus 25 and a noise current from the noise source Sn flows through a reference conductor of the connecting cable 35 which connects the reference electrode 12E of the signal input terminal 12 in the audio amplifier 11 and the reference electrode 26E of the output terminal 26 of the audio signal producing apparatus 25 with each other, so that a noise voltage corresponding to the product of the noise current and impedance Z1 rendered by the reference conductor of the connecting cable 35 arises. Similarly, with regard to a combination of the audio amplifier 11 and the audio signal producing apparatus 28, a noise current flows through a reference conductor of the connecting cable 36 which connects the reference electrode 13E of the signal input terminal 13 in the audio amplifier 11 and the reference electrode 29E of the output terminal 29 of the audio signal producing apparatus 28 with each other, so that a noise voltage corresponding to the product of the noise current and impedance Z2 rendered by the reference conductor of the connecting cable 36 arises. Further, with regard to a combination of the audio amplifier 11 and the audio signal producing apparatus 31, a noise current flows through a reference conductor of the connecting cable 37 which connects the reference electrode 14E of the signal input terminal 14 in the audio amplifier 11 and the reference electrode 32E of the output terminal 32 of the audio signal producing apparatus 31 with each other, so that a noise voltage corresponding to the product of the noise current and impedance Z3 rendered by the reference conductor of the connecting cable 37 arises.

Since the reference electrodes 12E, 13E and 14E of the signal input terminals 12 to 14 are coupled in common with the chassis 15 in the audio amplifier 11, each of the noise voltages arising between the audio amplifier 11 and the audio signal producing apparatus 25, between the audio amplifier 11 and the audio signal producing apparatus 28 and between the audio amplifier 11 and the audio signal producing apparatus 31, respectively, is added, through one of the signal input terminals 12 to 14 selected by the switch 20, to the signal supplied from the switch 20 to the signal processing block 21 in the audio amplifier 11 and therefore the signal supplied to the signal processing block 21 is deteriorated in a signal to noise ratio (S/N ratio).

OBJECTS AND SUMMARY OF THE INVENTION

Accordingly, it is an object of the present invention to provide an improved signal input selecting circuit including a plurality of signal input terminals each comprising a signal electrode and a reference electrode, to which a plurality of signals from external signal producing apparatus are supplied, respectively, and a switch device for selecting one of the signal input terminals to guide the signal supplied to the selected signal input terminal to a signal processing block, which avoids the aforementioned disadvantage and problem encountered with the prior art.

Another object of the present invention is to provide an improved signal input selecting circuit including a plurality of signal input terminals each comprising a signal electrode and a reference electrode, to which a plurality of signals from external signal producing apparatus are supplied, respectively, and a switch device for selecting one of the signal input terminals to guide the signal supplied to the selected signal input terminal to a signal processing block, which can suppress effectively noise components arising between the reference electrode of each signal input terminal and a reference electrode of an output terminal of the external signal producing apparatus connected to the signal input terminal so as to mix in the signal guided from the selected signal input terminal to the signal processing block.

A further object of the present invention is to provide an improved signal input selecting circuit including a plurality of signal input terminals each comprising a signal electrode and a reference electrode, to which a plurality of signals from external signal producing apparatus are supplied, respectively, and a switch device for selecting one of the signal input terminals to guide the signal supplied to the selected signal input terminal to a signal processing block, in which the reference electrode of the selected signal input terminal can be appropriately coupled with a reference potential point so that noise components arising on the reference electrode of each signal input terminal to mix in the signal guided from the selected signal input terminal to the signal processing block is effectively suppressed.

According to the present invention, there is provided a signal input selecting circuit comprising a plurality of signal input terminals each comprising a signal electrode and a reference electrode, a first switch device for selecting one of the signal electrodes of the signal input terminals to be connected with a signal processing block, a second switch device for selecting one of the reference electrodes of the signal input terminals to be connected with a reference potential point, a third switch device for connecting the second switch device to a current supplying portion, and a voltage detector for detecting a voltage corresponding to an impedance of the second switch device, wherein when the voltage detected by the voltage detector has a level thereof less than a predetermined level under a condition in which the second switch device is in operation to connect the reference electrode of a selected one of the signal input terminals with the reference potential point and the third switch device is in operation to connect the second switch device with the current supplying portion, the third switch device is turned to disconnect the second switch device from the current supplying portion and the first switch device is caused to connect the signal electrode of the selected one of the signal input terminals with the signal processing block.

In the signal input selecting circuit thus constituted in accordance with the present invention, the signal supplied to the reference electrode of the selected signal input terminal is supplied through the first switch device to the signal processing portion only when the reference electrode of the selected signal input terminal is connected with the reference potential point through the second switch device having its impedance which causes the voltage detected by the voltage detector to have the level thereof less than the predetermined level. This means that the signal supplied to the signal electrode of the selected signal input terminal is supplied through the first switch device to the signal processing portion only when the reference electrode of the selected signal input terminal is connected with the reference potential point through the second switch device having sufficiently low impedance. Therefore, noise voltages arising between the reference electrode of each signal input terminal and the reference electrode of an output of the signal generating apparatus connected to the signal input terminal are substantially short-circuited through the second switch device having sufficiently low impedance and the noise voltages mixing in the signal supplied from the selected signal input terminal to the signal processing block are surely and effectively suppressed.

In an embodiment of signal input selecting circuit according to the present invention, the first switch device comprises a plurality of first switching elements disposed between corresponding ones of the signal electrodes of the signal input terminals and the signal processing block, the second switch device comprises a plurality of second switching elements disposed between corresponding one of the reference electrodes of the signal input terminals and the reference potential point, and the third switch device comprises a plurality of third switching elements disposed between corresponding ones of the reference electrodes of the signal input terminals and the current supplying portion.

Further, in the embodiment, a switch controller is provided in addition for controlling at least the second switch device. The switch controller is operative to cause the second switch device which is in operation to connect the reference electrode of the selected signal input terminal with the reference potential point to disconnect the reference electrode with the reference potential point for a short period and thereafter to connect again the reference electrode to the reference potential point, so that a contact portion of the second switch device is subjected to self-cleaning to reduce the impedance thereof, when the voltage detected by the voltage detector has the level thereof equal to or more than the predetermined level.

The above and other objects, features and advantages of the present invention will become apparent from the following detailed description taken in conjunction with the accompanying drawings.

BRIEF DESCRIPTION OF THE DRAWINGS

FIG. 4 is a flow chart showing an example of an operation program carried out in a control unit composed of a microcomputer in the second embodiment shown in FIG. 2.

DESCRIPTION OF THE PREFERRED EMBODIMENTS

Figure 1:
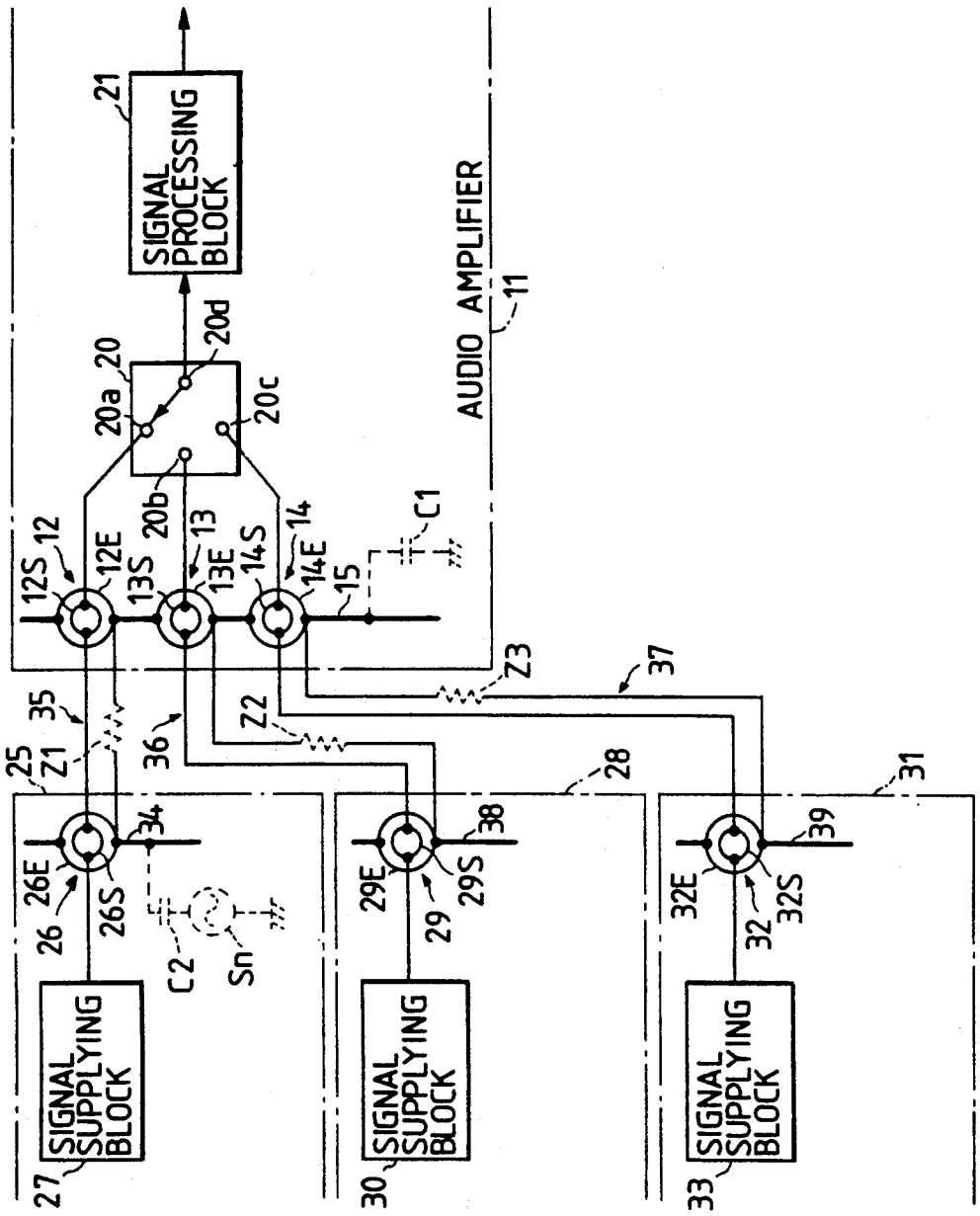
FIG. 1 is a schematic circuit diagram showing a part of a sound reproducing system employing a previously proposed signal input selecting circuit.
Figure 2:
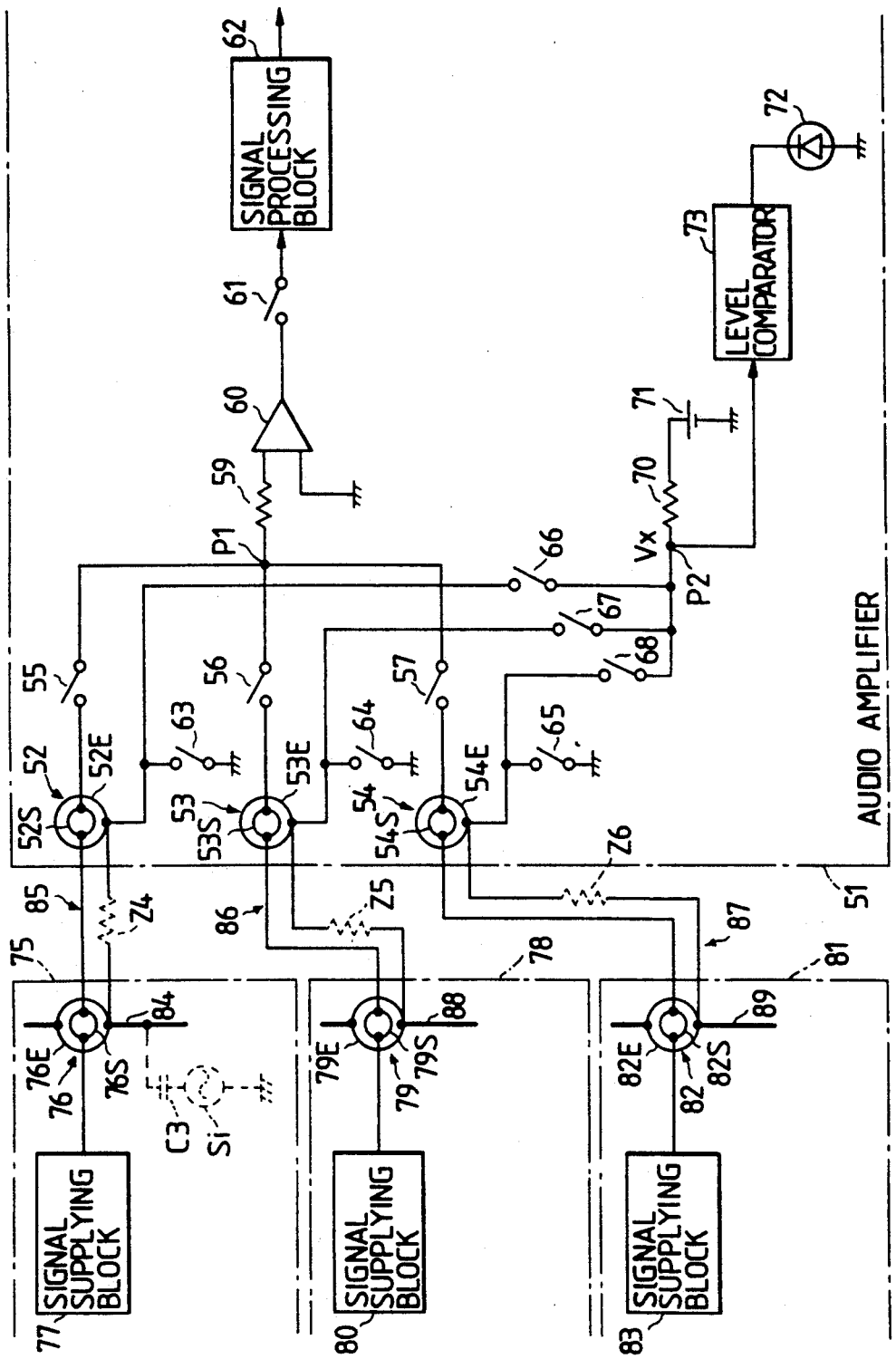
FIG. 2 is a circuit diagram showing a part of a sound reproducing system to which a first embodiment of signal input selecting circuit according to the present invention is applied.

FIG. 2 shows a part of a sound reproducing system to which an embodiment of signal input selecting circuit according to the present invention is applied. In the part of the sound reproducing system shown in FIG. 2, an audio amplifier 51 having three signal input terminals 52, 53 and 54 is provided.

The signal input terminal 52 comprises a signal electrode 52S and a reference electrode 52E, the signal input terminal 53 comprises a signal electrode 53S and a reference electrode 53E, and the signal input terminal 54 comprises a signal electrode 54S and a reference electrode 54E. The signal electrodes 52S, 53S and 54S constituting the signal input terminals 52, 53 and 54 are coupled through switching elements 55, 56 and 57, respectively, with a common connecting point P1. The common connecting point P1 is connected through a resistor 59 with a buffer portion 60 and an output terminal of the buffer portion 60 is connected though a switching element 61 with a signal processing block 62.

The reference electrodes 52E, 53E and 54E constituting the signal input terminal 52, 53, and 54 are coupled through switching elements 63, 64 and 65, respectively, with a chassis contained in the audio amplifier 51, which provides a reference potential point in the audio amplifier 51. Further, the reference electrodes 52E, 53E and 54E are also coupled through switching elements 66, 67 and 68, respectively, with a common connecting point P2. The common connecting point P2 is connected through a resistor 70 with a voltage source 71 which comprises a battery. The resistor 70 and the voltage source 71 constitute a current supplying portion. A level comparator 73 provided with a light emitting element 72 is connected with the common connecting point P2. A first embodiment of signal input selecting circuit according to the present invention is constituted by various elements, devices and parts contained in the audio amplifier 51 with the exception of the signal processing block 62. Especially, each of the switching elements 66, 67 and 68 is selected to be surely put in appropriate ON and OFF states alternately.

The signal input terminals 52 to 54 are connected to an output terminal 76 of an audio signal producing apparatus 75, an output terminal 79 of an audio signal producing apparatus 78 and an output terminal 82 of an audio signal producing apparatus 81, respectively. The output terminal 76 of the audio signal producing apparatus 75 comprises a signal electrode 76S and a reference electrode 76E. The signal electrode 76S is coupled with a signal supplying block 77 contained in the audio signal producing apparatus 75 and the reference electrode 76E is coupled with a chassis 84 contained in the audio signal producing apparatus 75. Further, the signal electrode 76S and the reference electrode 76E are connected, through a connecting cable 85, to the signal electrode 52S and the reference electrode 52E of the signal input terminal 52 provided in the audio amplifier 51, respectively. With such an arrangement, an audio signal obtained from the signal supplying block 77 contained in the audio signal producing apparatus 75 is supplied from the signal electrode 76S of the output terminal 76 through the connecting cable 85 to the signal electrode 52S of the signal input terminal 52 in the audio amplifier 51.

The output terminal 79 of the audio signal producing apparatus 78 comprises a signal electrode 79S and a reference electrode 79E. The signal electrode 79S and the reference electrode 79E are coupled with a signal supplying block 80 and a chassis 88 contained in the audio signal producing apparatus 78, respectively, and further connected through a connecting cable 86 to the signal electrode 53S and the reference electrode 53E of the signal input terminal 53 provided in the audio amplifier 51, respectively.

Similarly, the output terminal 82 of the audio signal producing apparatus 81 comprises a signal electrode 82S and a reference electrode 82E. The signal electrode 82S and the reference electrode 82E are coupled with a signal supplying block 83 and a chassis 89 contained in the audio signal producing apparatus 81, respectively, and further connected through a connecting cable 87, to the signal electrode 54S and the reference electrode 54E of the signal input terminal 54 provided in the audio amplifier 51, respectively.

With such arrangements, an audio signal obtained from the signal supplying block 80 contained in the audio signal producing apparatus 78 is supplied from the signal electrode 79S of the output terminal 79 through the connecting cable 86 to the signal electrode 53S of the signal input terminal 53 in the audio amplifier 51, and an audio signal obtained from the signal supplying block 83 contained in the audio signal producing apparatus 81 is supplied from the signal electrode 82S of the output terminal 82 through the connecting cable 87 to the signal electrode 54S of the signal input terminal 54 in the audio amlifier 51.

In the signal input selecting circuit constituted in the sound reproducing system as shown in FIG. 2, potential differences between the reference potential point in the audio amplifier 51 and each of the chassis 84 contained in the audio signal producing apparatus 75, the chassis 88 contained in the audio signal producing apparatus 78 and the chassis 89 contained in the audio signal producing apparatus 81 provide noise sources between the audio amplifier 51 and each of the audio signal producing apparatus 75, 78 and 81. For example, with regard to a combination of the audio amplifier 51 and the audio signal producing apparatus 75, a noise source Si is equivalently connected through a stray capacitor C3 to the chassis 84 contained in the audio signal producing apparatus 75 and a noise current from the noise source Si flows through a reference conductor of the connecting cable 85 which connects the reference electrode 52E of the signal input terminal 52 in the audio amplifier 51 and the reference electrode 76E of the output terminal 76 of the audio signal producing apparatus 75 with each other, so that a noise voltage corresponding to the product of the noise current and impedance Z4 rendered by the reference conductor of the connecting cable 85 arises. Similarly, with regard to a combination of the audio amplifier 51 and the audio signal producing apparatus 78, a noise current flows through a reference conductor of the connecting cable 86 which connects the reference electrode 53E of the signal input terminal 53 in the audio amplifier 51 and the reference electrode 79E of the output terminal 79 of the audio signal producing apparatus 78 with each other, so that a noise voltage corresponding to the product of the noise current and impedance Z5 rendered by the reference conductor of the connecting cable 86 arises. Further, with regard to a combination of the audio amplifier 51 and the audio signal producing apparatus 81, a noise current flows through a reference conductor of the connecting cable 87 which connects the reference electrode 54E of the signal input terminal 54 in the audio amplifier 51 and the reference electrode 82E of the output terminal 82 of the audio signal producing apparatus 81 with each other, so that a noise voltage corresponding to the product of the noise current and impedance Z6 rendered by the reference conductor of the connecting cable 87 arises.

Under such a condition as described above, one of the audio signal obtained from the signal supplying block 77 contained in the audio signal producing apparatus 75 which is connected with the signal input terminal 52 in the audio amplifier 51, the audio signal obtained from the signal supplying block 80 contained in the audio signal producing apparatus 78 which is connected with the signal input terminal 53 in the audio amplifier 51, and the audio signal obtained from the signal supplying block 83 contained in the audio signal producing apparatus 81 which is connected with the signal input terminal 54 in the audio amplifier 51 is selected to be supplied to the signal processing block 62 contained in the audio amplifier 51.

In the case where the audio signal obtained from the signal supplying block 77 contained in the audio signal producing apparatus 75 which is connected with the signal input terminal 52 in the audio amplifier 51 is selected to be supplied to the signal processing block 62 contained in the audio amplifier 51, first, each of the switching elements 63 and 66 out of the switching elements 55 to 57, 61, 63 to 68 are turned on and each of other switching elements is maintained in the Off state. Thereby, a current from the current supplying portion constituted by the resistor 70 and the voltage source 71 flows through the switching elements 66 and 63 to the reference potential point in the audio amplifier 51 and the level of a voltage Vx obtained at the common connecting point P2 is detected by the level comparator 73. Although the voltage Vx obtained at the common connecting point P2 is a voltage across a series connection of the switching elements 63 and 66, since the switching element 66 is especially selected to be surely put in the appropriate ON state so as to have very low impedance, the voltage Vx at the common connecting point P2 corresponds substantially to a voltage across the switching element 63. This results in that the voltage Vx at the common connecting point P2 has the level thereof representing the impedance of the switching element 63. Therefore, the level of the voltage Vx is low when the switching element 63 is in such appropriate ON state as to have a very low impedance and high when the switching element 63 is in such inappropriate ON state as to have a relatively high impedance.

In the level comparator 73, the level of the voltage Vx is compared with a reference level which is relatively low. It is decided that the impedance of the switching element 63 is very low and therefore the switching element 63 is in the appropriate ON state and the light emitting element 72 is kept inoperative when the level of the voltage Vx is less than the reference level. To the contrary, it is decided that the impedance of the switching element 63 is relatively high and therefore the switching element 63 is in the inappropriate ON state and the light emitting element 72 is caused to make light emission intermittently when the level of the voltage Vx is equal to or more than the reference level. In the manner as mentioned above, the level comparator 73 constitutes an impedance detecting portion for detecting the impedance of the switching element 63 in its ON state.

When the level of the voltage Vx is equal to or more than the reference level and the light emitting element 72 is in process of intermittent light emission, a relatively high impedance is provided between the reference electrode 52E of the signal input terminal 52 and the reference potential point in the audio amplifier 51 and therefore the noise voltage which arises between the signal input terminal 52 and the audio signal producing apparatus 75 to correspond to the product of the noise current flowing through the reference conductor of the connecting cable 85 and the impedance Z4 rendered by the reference conductor of the connecting cable 85 is added with a relatively large level to the audio signal supplied to the signal electrode 52S of the signal input terminal 52. Accordingly, in such a case, the audio signal obtained from the signal supplying block 77 contained in the audio signal producing apparatus 75 connected with the signal input terminal 52 is prevented from being supplied to the signal processing block 62 contained in the audio amplifier 51 and instead some measures for causing the switching element 63 to be in the appropriate ON state is carried out.

On the other hand, when the level of the voltage Vx is less than the reference level and the light emitting element 72 is kept inoperative, a very low impedance is provided between the reference electrode 52E of the signal input terminal 52 and the reference potential point in the audio amplifier 51 and therefore the noise voltage which arises between the signal input terminal 52 and the audio signal producing apparatus 75 to correspond to the product of the noise current flowing through the reference conductor of the connecting cable 85 and the impedance Z4 rendered by the reference conductor of the connecting cable 85 is effectively suppressed to have little effect on the audio signal supplied to the signal electrode 52S of the signal input terminal 52. Accordingly, in such a case, the switching element 66 is turned off and each of the switching elements 55 and 61 is turned on, so that the audio signal which is obtained from the signal supplying block 77 contained in the audio signal producing apparatus 75 and supplied through the signal electrode 76S of the output terminal 76 and the connecting cable 85 to the signal electrode 52S of the signal input terminal 52 is further supplied through the switching element 55, the common connecting point P1, the resistor 59, the buffer portion 60 and the switching element 61 to the signal processing block 62 contained in the audio amplifier 51.

In such a condition, each of the switching elements 64 and 65 coupled with the reference electrode 53E of the signal input terminal 53 and the reference electrode 54E of the signal input terminal 54, respectively, is in the OFF state and therefore each of the reference electrodes 53E and 54E are not connected with the reference potential point in the audio amplifier 51. Consequently, the noise voltage which arises between the signal input terminal 53 and the audio signal producing apparatus 78 to correspond to the product of the noise current flowing through the reference conductor of the connecting cable 86 and the impedance Z5 rendered by the reference conductor of the connecting cable 86 has no effect on the audio signal supplied to the signal electrode 52S of the signal input terminal 52 and similarly the noise voltage which arises between the signal input terminal 54 and the audio signal producing apparatus 81 to correspond to the product of the noise current flowing through the reference conductor of the connecting cable 87 and the impedance Z6 rendered by the reference conductor of the connecting cable 87 has no effect on the audio signal supplied to the signal electrode 52S of the signal input terminal 52.

In the case where the audio signal obtained from the signal supplying block 80 contained in the audio signal producing apparatus 78 which is connected with the signal input terminal 53 in the audio amplifier 51 is selected to be supplied to the signal processing block 62 contained in the audio amplifier 51, first, each of the switching elements 64 and 67 out of the switching elements 55 to 57, 61, 63 to 68 are turned on and each of other switching elements is maintained in the OFF state. Thereby, a current from the current supplying portion constituted by the resistor 70 and the voltage source 71 flows through the switching elements 67 and 64 to the reference potential point in the audio amplifier 51 and the level of the voltage Vx obtained at the common connecting point P2 is detected by the level comparator 73. In the level comparator 73, the level of the voltage Vx is compared with a reference level which is relatively low. It is decided that the impedance of the switching element 64 is very low and therefore the switching element 64 is in the appropriate ON state and the light emitting element 72 is kept inoperative when the level of the voltage Vx is less than the reference level. To the contrary, it is decided that the impedance of the switching element 64 is relatively high and therefore the switching element 64 is in the inappropriate ON state and the light emitting element 72 is caused to make light emission intermittently when the level of the voltage Vx is equal to or more than the reference level. In the manner as mentioned above, the level comparator 73 constitutes also an impedance detecting portion for detecting the impedance of the switching element 64 in its ON state.

When the level of the voltage Vx is equal to or more than the reference level and the light emitting element 72 is in process of intermittent light emission, a relatively high impedance is provided between the reference electrode 53E of the signal input terminal 53 and the reference potential point in the audio amplifier 51 and therefore the noise voltage which arises between the signal input terminal 53 and the audio signal producing apparatus 78 to correspond to the product of the noise current flowing through the reference conductor of the connecting cable 86 and the impedance Z5 rendered by the reference conductor of the connecting cable 86 is added with a relatively large level to the audio signal supplied to the signal electrode 53S of the signal input terminal 53. Accordingly, in such a case, the audio signal obtained from the signal supplying block 80 contained in the audio signal producing apparatus 78 connected with the signal input terminal 53 is prevented from being supplied to the signal processing block 62 contained in the audio amplifier 51 and instead some measures for causing the switching element 64 to be in the appropriate ON state is carried out.

On the other hand, when the level of the voltage Vx is less than the reference level and the light emitting element 72 is kept inoperative, a very low impedance is provided between the reference electrode 53E of the signal input terminal 53 and the reference potential point in the audio amplifier 51 and therefore the noise voltage which arises between the signal input terminal 53 and the audio signal producing apparatus 78 to correspond to the product of the noise current flowing through the reference conductor of the connecting cable 86 and the impedance Z5 rendered by the reference conductor of the connecting cable 86 is effectively suppressed to have little effect on the audio signal supplied to the signal electrode 53S of the signal input terminal 53. Accordingly, in such a case, the switching element 67 is turned off and each of the switching elements 56 and 61 is turned on, so that the audio signal which is obtained from the signal supplying block 80 contained in the audio signal producing apparatus 78 and supplied through the signal electrode 79S of the output terminal 79 and the connecting cable 86 to the signal electrode 53S of the signal input terminal 53 is further supplied through the switching element 56, the common connecting point P1, the resistor 59, the buffer portion 60 and the switching element 61 to the signal processing block 62 contained in the audio amplifier 51.

In such a condition, each of the switching elements 63 and 65 coupled with the reference electrode 52E of the signal input terminal 52 and the reference electrode 54E of the signal input terminal 54, respectively, is in the OFF state and therefore each of the reference electrodes 52E and 54E are not connected with the reference potential point in the audio amplifier 51. Consequently, the noise voltage which arises between the signal input terminal 52 and the audio signal producing apparatus 75 to correspond to the product of the noise current flowing through the reference conductor of the connecting cable 85 and the impedance Z4 rendered by the reference conductor of the connecting cable 85 has no effect on the audio signal supplied to the signal electrode 53S of the input terminal terminal 53 and similarly the noise voltage which arises between the signal input terminal 54 and the audio signal producing apparatus 81 to correspond to the product of the noise current flowing through the reference conductor of the connecting cable 87 and the impedance Z6 rendered by the reference conductor of the connecting cable 87 has no effect on the audio signal supplied to the signal electrode 53S of the signal input terminal 53.

Further, in the case where the audio signal obtained from the signal supplying block 83 contained in the audio signal producing apparatus 81 which is connected with the signal input terminal 54 in the audio amplifier 51 is selected to be supplied to the signal processing block 62 contained in the audio amplifier 51, first, each of the switching elements 65 and 68 out of the switching elements 55 to 57, 61, 63 to 68 are turned on and each of other switching elements is maintained in the OFF state. Thereby, a current from the current supplying portion constituted by the resistor 70 and the voltage source 71 flows through the switching elements 68 and 65 to the reference potential point in the audio amplifier 51 and the level of the voltage Vx obtained at the common connecting point P2 is detected by the level comparator 73. In the level comparator 73, the level of the voltage Vx is compared with a reference level which is relatively low. It is decided that the impedance of the switching element 65 is very low and therefore the switching element 65 is in the appropriate ON state and the light emitting element 72 is kept inoperative when the level of the voltage Vx is less than the reference level. To the contrary, it is decided that the impedance of the switching element 65 is relatively high and therefore the switching element 65 is in the inappropriate ON state and the light emitting element 72 is caused to make light emission intermittently when the level of the voltage Vx is equal to or more than the reference level. In the manner as mentioned above, the level comparator 73 constitutes also an impedance detecting portion for detecting the impedance of the switching element 65 in its ON state.

When the level of the voltage Vx is equal to or more than the reference level and the light emitting element 72 is in process of intermittent light emission, a relatively high impedance is provided between the reference electrode 54E of the signal input terminal 54 and the reference potential point in the audio amplifier 51 and therefore the noise voltage which arises between the signal input terminal 54 and the audio signal producing apparatus 81 to correspond to the product of the noise current flowing through the reference conductor of the connecting cable 87 and the impedance Z6 rendered by the reference conductor of the connecting cable 87 is added with a relatively large level to the audio signal supplied to the signal electrode 54S of the signal input terminal 54. Accordingly, in such a case, the audio signal obtained from the signal supplying block 83 contained in the audio signal producing apparatus 81 connected with the signal input terminal 54 is prevented from being supplied to the signal processing block 62 contained in the audio amplifier 51 and instead some measures for causing the switching element 65 to be in the appropriate ON state is carried out.

On the other hand, when the level of the voltage Vx is less than the reference level and the light emitting element 72 is kept inoperative, a very low impedance is provided between the reference electrode 54E of the signal input terminal 54 and the reference potential point in the audio amplifier 51 and therefore the noise voltage which arises between the signal input terminal 54 and the audio signal producing apparatus 81 to correspond to the product of the noise current flowing through the reference conductor of the connecting cable 87 and the impedance Z6 rendered by the reference conductor of the connecting cable 87 is effectively suppressed to have little effect on the audio signal supplied to the signal electrode 54S of the signal input terminal 54. Accordingly, in such a case, the switching element 68 is turned off and each of the switching elements 57 and 61 is turned on, so that the audio signal which is obtained from the signal supplying block 83 contained in the audio signal producing apparatus 81 and supplied through the signal electrode 82S of the output terminal 82 and the connecting cable 87 to the signal electrode 54S of the signal input terminal 54 is further supplied through the switching element 57, the common connecting point P1, the resistor 59, the buffer portion 60 and the switching element 61 to the signal processing block 62 contained in the audio amplifier 51.

In such a condition, each of the switching elements 63 and 64 coupled with the reference electrode 52E of the signal input terminal 52 and the reference electrode 53E of the signal input terminal 53, respectively, is in the OFF state and therefore each of the reference electrodes 52E and 53E are not connected with the reference potential point in the audio amplifier 51. Consequently, the noise voltage which arises between the signal input terminal 52 and the audio signal producing apparatus 75 to correspond to the product of the noise current flowing through the reference conductor of the connecting cable 85 and the impedance Z4 rendered by the reference conductor of the connecting cable 85 has no effect on the audio signal supplied to the signal electrode 54S of the signal input terminal 54 and similarly the noise voltage which arises between the signal input terminal 53 and the audio signal producing apparatus 78 to correspond to the product of the noise current flowing through the reference conductor of the connecting cable 86 and the impedance Z5 rendered by the reference conductor of the connecting cable 86 has no effect on the audio signal supplied to the signal electrode 54S of the signal input terminal 54.

In the first embodiment described above, it is desired that a control unit which may be constituted by a microcomputer is provided for controlling automatically switching operations of the switching elements 55 to 57, 61 and 63 to 68. Further, although three signal input terminals 52, 53 and 54 are provided in the embodiment shown in FIG. 2, it is to be understood that the number of the signal input terminals is not limited to be three but two or more than three signal input terminals can be provided in the signal input selecting circuit according to the present invention.

Figure 3:
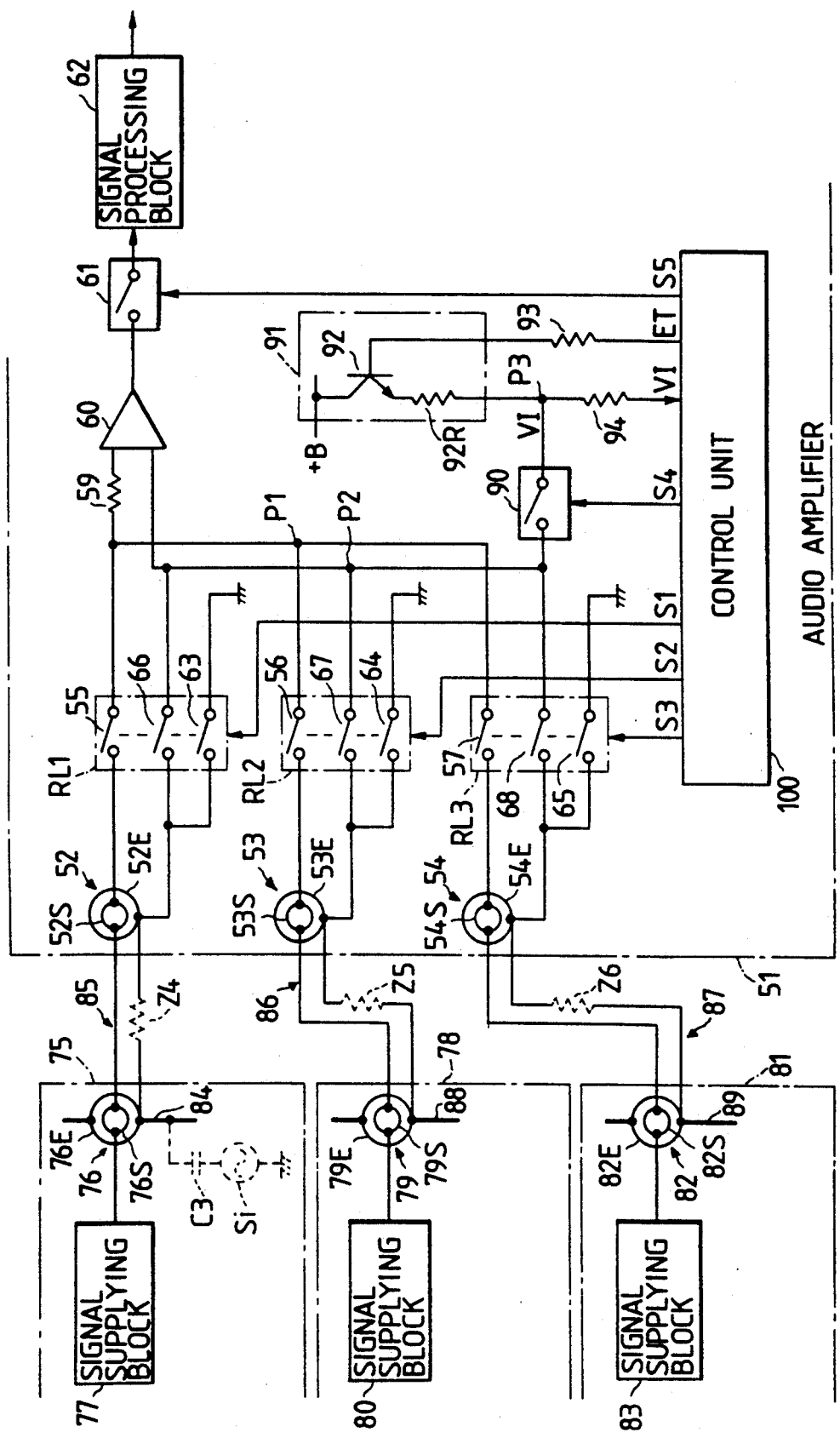
FIG. 3 is a circuit diagram showing a part of a sound reproducing system to which a second embodiment of signal input selecting circuit according to the present invention is applied.

FIG. 3 shows a part of a sound reproducing system to which another embodiment of signal input selecting circuit according to the present invention is applied. In the part of the sound reproducing system shown in FIG. 3, elements, devices, parts and apparatus corresponding to those of the part of the sound reproducing system shown in FIG. 2 are marked with the same references and further description thereof will be omitted.

The part of the sound reproducing system shown in FIG. 3 is provided also with an audio amplifier 51 having three signal input terminals 52, 53 and 54. In the audio amplifier 51, a common connecting point P2 to which switching elements 66, 67 and 68 are connected in common is connected through a switching element 90 with a current supplying portion 91 and a connecting point P3 is provided between the switching element 90 and the current supplying portion 91. The current supplying portion 91 comprises an NPN type transistor 92 having its collector coupled with a voltage source +B and a resistor 92R provided for connecting an emitter of the NPN type transistor 92 with the connecting point P3.

In the audio amplifier 51 shown in FIG. 3, switching elements 55, 63 and 66 each connected with the signal input terminal 52 are arranged to constitute a relay RL1 and to operate simultaneously, switching elements 56, 64 and 67 each connected with the signal input terminal 53 are arranged to constitute a relay RL2 and to operate simultaneously, and switching elements 57, 65 and 68 each connected with the signal input terminal 54 are arranged to constitute a relay RL3 and to operate simultaneously.

Further, a control unit 100 is provided for controlling the operation of each of the relays RL1, RL2 and RL3, the switching elements 61 and 90 and the current supplying portion 91. The control unit 100 is supplied with a voltage VI obtained at the connecting point P3 through a resistor 94 and operative to supply the relay RL1, the relay RL2, the relay RL3, the switching element 90 and the switching element 61 with control signals S1, S2, S3, S4 and S5 each having selectively a high level H and a low level L, respectively, and further to supply a base of the NPN type transistor 92 with a control voltage ET having selectively a high level VH and a low level VL. Besides, a voltage VI obtained at the connecting point P3 between the switching element 90 and the current supplying portion 91 is supplied through a resistor 94 to the control unit 100.

In the relay RL1 to which the control signal S1 is supplied, each of the switching elements 55, 63 and 66 is in the ON state when the control signal S1 has the high level H and each of the switching elements 55, 63 and 66 is in the OFF state when the control signal S1 has the low level L.

In the relay RL2 to which the control signal S2 is supplied, each of the switching elements 56, 64 and 67 is in the ON state when the control signal S2 has the high level H and each of the switching elements 56, 64 and 67 is in the OFF state when the control signal S2 has the low level L.

In the relay RL3 to which the control signal S3 is supplied, each of the switching elements 57, 65 and 68 is in the ON state when the control signal S3 has the high level H and each of the switching elements 57, 65 and 68 is in the OFF state when the control signal S3 has the low level L.

Further, the switching element 90 to which the control signal S4 is supplied is in the ON state when the control signal S4 has the high level H and in the OFF state when the control signal S4 has the low level L, and the switching element 61 to which the control signal S5 is supplied is in the ON state when the control signal S5 has the high level H and in the OFF state when the control signal S5 has the low level L.

The NPN type transistor 92, a base of which is supplied with the control voltage ET, is in the ON state wherein a current from the voltage source +B flows through a collector-emitter path of the NPN type transistor 92 and the resistor 92R to the reference potential point in the audio amplifier 51 when the control voltage has the high level VH and in the OFF state wherein the current from the voltage source +B is prevented from flowing through the collector-emitter path of the NPN type transistor 92 and the resistor 92R to the reference potential point in the audio amplifier 51 when the control voltage ET has the low level VL. Accordingly, the current supplying portion 91 is operative to supply a current flowing through the connecting point P3 and the switching element 90 when the control voltage ET has the high level VH and inoperative to supply any current when the control voltage ET has the low level VL.

In the part of the sound reproducing system shown in FIG. 3, a second embodiment of signal input selecting circuit according to the present invention is constituted by various elements, devices and parts contained in the audio amplifier 51 with the exception of the signal processing block 62. In the second embodiment shown in FIG. 3, the switching elements 55, 56, 57 and 61 constitute a first switch device which is operative to connect selectively a selected one of the signal electrode 52S of the signal input terminal 52, the signal electrode 53S of the signal input terminal 53 and the signal electrode 54S of the signal input terminal 54 through the resistor 59 and the buffer portion 60 to the signal processing block 62 contained in the audio amplifier 51, the switching elements 63, 64 and 65 constitute a second switch device which is operative to connect selectively a selected one of the reference electrode 52E of the signal input terminal 52, the reference electrode 53E of the signal input terminal 53 and the reference electrode 54E of the signal input terminal 54 to the reference potential point in the audio amplifier 51, and the switching elements 66, 67, 68 and 90 constitute a third switch device which is operative to connect selectively the second switch device constituted by the switching elements 63, 64 and 65 to the current supplying portion 91. The control unit 100 constitutes both of a voltage detector for detecting the voltage obtained at the connecting point P3 and a switching controller for controlling operations of the first switch device constituted by the switching elements 55, 56 and 57, the second switch device constituted by the switching elements 63, 64 and 65 and the third switch device constituted by the switching elements 66, 67, 68 and 90.

The signal input terminals 52 to 54 are connected to an output terminal 76 of an audio signal producing apparatus 75, an output terminal 79 of an audio signal producing apparatus 78 and an output terminal 82 of an audio signal producing apparatus 81, respectively, in the same manner as the signal input terminals 52 to 54 in the first embodiment shown in FIG. 2. Under such a condition as described above, one of the audio signal obtained from the signal supplying block 77 contained in the audio signal producing apparatus 75 which is connected with the signal input terminal 52 in the audio amplifier 51, the audio signal obtained from the signal supplying block 80 contained in the audio signal producing apparatus 78 which is connected with the signal input terminal 53 in the audio amplifier 51, and the audio signal obtained from the signal supplying block 83 contained in the audio signal producing apparatus 81 which is connected with the signal input terminal 54 in the audio amplifier 51 is selected to be supplied to the signal processing block 62 contained in the audio amplifier 51.

In the case where the audio signal obtained from the signal supplying block 77 contained in the audio signal producing apparatus 75 which is connected with the signal input terminal 52 in the audio amplifier 51 is selected to be supplied to the signal processing block 62 contained in the audio amplifier 51, first, under a condition in which each of the control signals S1 to S5 from the control unit 100 is caused to have the low level L so that each of the switching elements 55 to 57, 61, 63 to 68 and 90 is kept in the OFF state and the control voltage ET from the control unit 100 is caused to have the low level VL so that the NPN type transistor 92 is also kept in the OFF state, only the control signal S1 is changed to have the high level H so that each of the switching elements 55, 63 and 66 constituting the relay RL1 is turned on. Then, the control signal S4 from the control unit 100 is changed to have the high level H so that the switching element 90 is turned on and the control voltage ET is changed to have the high level VH so that the NPN type transistor 92 is turned on. Thereby, a current from the current supplying portion 91 flows through the connecting point P3 and the switching elements 90, 66 and 63 to the reference potential point in the audio amplifier 51 and the voltage VI having its level corresponding to an impedance of a series connection of the switching elements 90, 66 and 63 obtained at the connecting point P3. The voltage VI is supplied through the resistor 94 to the control unit 100 and the level of the voltage VI is detected by the control unit 100. The level of the voltage VI is less than the predetermined relatively low level VO when each of the switching elements 90, 66 and 63 has the very low impedance and equal to or more than the predetermined relatively low level VO when at least one of the switching elements 90, 66 and 63 has a relatively high impedance.

When the level of the voltage VI obtained at the connecting point P3 is less than the predetermined relatively low level VO, that is, each of the switching elements 90, 66 and 63 has the very low impedance, the switching element 63 provides a very low impedance between the reference electrode 52E of the signal input terminal 52 and the reference potential point in the audio amplifier 51 and therefore a noise voltage which arises between the signal input terminal 52 and the audio signal producing apparatus 75 to correspond to the product of a noise current flowing through a reference conductor of a connecting cable 85 which connects the signal input terminal 52 with the output terminal 76 of the audio signal producing apparatus 75 and an impedance Z4 rendered by the reference conductor of the connecting cable 85 is effectively suppressed to have little effect on an audio signal supplied to the signal electrode 52S of the signal input terminal 52. Accordingly, in such a case, the control voltage ET from the control unit 100 is changed to have the low level VL so that the NPN type transistor 92 is turned off and the control signal S4 from the control unit 100 is changed to have the low level L so that the switching element 90 is turned off and thereby the current from the current supplying portion 91 is prevented from flowing through the switching elements 66 and 63 to the reference potential point in the audio amplifier 51. Then, the control signal S5 from the control unit 100 is changed to have the high level H so that the switching element 61 is turned on, so that an audio signal which is obtained from a signal supplying block 77 contained in the audio signal producing apparatus 75 and supplied through a signal electrode 76S of the output terminal 76 and the connecting cable 85 to the signal electrode 52S of the signal input terminal 52 is further supplied through the switching element 55, a common connecting point P1, the resistor 59, the buffer portion 60 and the switching element 61 to the signal processing block 62 contained in the audio amplifier 51.

On the other hand, when the level of the voltage VI, which is obtained at the connecting point P3 under a condition wherein the current from the current supplying portion 91 flows through the connecting point P3 and the switching elements 90, 66 and 63 to the reference potential point in the audio amplifier 51, is equal to or more than the predetermined relatively low level VO, that is, at least one of the switching elements 90, 66 and 63 has the relatively high impedance, it is feared that the switching element 63 provides a relatively high impedance between the reference electrode 52E of the signal input terminal 52 and the reference potential point in the audio amplifier 51 and therefore the noise voltage which arises between the signal input terminal 52 and the audio signal producing apparatus 75 to correspond to the product of the noise current flowing through the reference conductor of the connecting cable 85 and the impedance Z4 rendered by the reference conductor of the connecting cable 85 is added with a relatively large level to the audio signal supplied to the signal electrode 52S of the signal input terminal 52. Accordingly, in such a case, the audio signal obtained from the signal supplying block 77 contained in the audio signal producing apparatus 75 connected with the signal input terminal 52 is prevented from being supplied to the signal processing block 62 contained in the audio amplifier 51 and instead some measures for reducing the level of the voltage VI obtained at the connecting point P3 to be less than the predetermined relatively low level VO.

When the level of the voltage VI, which is obtained at the connecting point P3 under a condition wherein the current from the current supplying portion 91 flows through the connecting point P3 and the switching elements 90, 66 and 63 to the reference potential point in the audio amplifier 51, is equal to or more than the predetermined relatively low level VO, it is quite probable that one of the switching elements 63, 66 and 90 has a contact portion thereof to which insulating material is undesirably attached so as to provide increased contact resistance. Accordingly, each of the switching elements 63, 66 and 90 is turned off and turned on successively under a condition in which the current from the current supplying portion 91 is able to flow through the connecting point P3 and the switching elements 90, 66 and 63 to the reference potential point in the audio amplifier 51 and thereby the contact portion of each of the switching elements 63, 66 and 90 is subjected to a self-cleaning operation for removing the insulating material undesirably attached thereto.

On the occasion of such a self-cleaning operation, the control signal S1 from the control unit 100 is changed to have the low level L and then, after a predetermined short period, the control signal S1 is changed again to have the high level H, so that each of the switching elements 55, 63 and 66 is turned off and turned on successively. As a result, if the voltage VI obtained at the connecting point P3 comes to have a level less than the predetermined relatively low level VO, the voltage VI having the level equal to or more than the predetermined relatively low level VO was caused by one of the switching elements 63 and 66, and the switching element 63 or 66 has been recovered to have the very low impedance by the self-cleaning operation and the switching element 63 provides a very low impedance between the reference electrode 52E of the signal input terminal 52 and the reference potential point in the audio amplifier 51. Accordingly, the control voltage ET from the control unit 100 is changed to have the low level VL and the control signals S4 and S5 from the control unit 100 are changed to have the low level L and the high level H, respectively, so that the audio signal obtained from the signal supplying block 77 contained in the audio signal producing apparatus 75 connected with the signal input terminal 52 is supplied to the signal processing block 62 contained in the audio amplifier 51.

To the contrary, if the voltage VI obtained at the connecting point P3 continues to have the level equal to or more than the predetermined relatively low level VO after the self-cleaning operation, the control signal S4 from the control unit 100 is changed to have the low level L and then immediately changed again to have the high level H, so that the switching element 90 is turned off and turned on successively to cause the contact portion thereof to be subjected to the self-cleaning operation. As a result, if the voltage VI obtained at the connecting point P3 comes to have a level less than the predetermined relatively low level VO, the voltage VI having the level equal to or more than the predetermined relatively low level VO was caused by the switching elements 90, and the switching element 90 has been recovered to have the very low impedance by the self-cleaning operation and the switching element 63 provides the very low impedance between the reference electrode 52E of the signal input terminal 52 and the reference potential point in the audio amplifier 51. Accordingly, the control voltage ET from the control unit 100 is changed to have the low level VL and the control signals S4 and S5 from the control unit 100 are changed to have the low level L and the high level H, respectively, so that the audio signal obtained from the signal supplying block 77 contained in the audio signal producing apparatus 75 connected with the signal input terminal 52 is supplied to the signal processing block 62 contained in the audio amplifier 51.

Further, if the voltage VI obtained at the connecting point P3 continues to have the level equal to or more than the predetermined relatively low level VO after the contact portion of each of the switching elements 55, 63, 66 and 90 has been subjected to the self-cleaning operation carried out as mentioned above, the contact portion of each of the switching elements 55, 63, 66 and 90 is repeatedly subjected to the self-cleaning operation for the purpose of causing the voltage VI at the connecting point P3 to have the level less than the predetermined relatively low level VO. In the case where the voltage VI at the connecting point P3 comes to have the level less than the predetermined relatively low level VO before the self-cleaning operation to the contact portion of each of the switching elements 55, 63, 66 and 90 has been repeated as many as a predetermined number of times, for example, twenty times, the control voltage ET from the control unit 100 is changed to have the low level VL and the control signals S4 and S5 from the control unit 100 are changed to have the low level L and the high level H, respectively, so that the audio signal obtained from the signal supplying block 77 contained in the audio signal producing apparatus 75 connected with the signal input terminal 52 is supplied to the signal processing block 62 contained in the audio amplifier 51.

On the other hand, in the case where the voltage VI at the connecting point P3 continues to have the level equal to or more than the predetermined relatively low level VO after the self-cleaning operation to the contact portion of each of the switching elements 55, 63, 66 and 90 has been repeated twenty times, it is judged that at least one of the switching elements 63, 66 and 90 is unable to be recovered to have the very low impedance by the self-cleaning operation and therefore the audio signal obtained from the signal supplying block 77 contained in the audio signal producing apparatus 75 connected with the signal input terminal 52 is maintained not to be supplied to the signal processing block 62 contained in the audio amplifier 51.

When the audio signal obtained from the signal supplying block 77 contained in the audio signal producing apparatus 75 connected with the signal input terminal 52 is supplied to the signal processing block 62 contained in the audio amplifier 51 under a condition wherein it is secured that the switching element 63 provides the very low impedance between the reference electrode 52E of the signal input terminal 52 and the reference potential point in the audio amplifier 51 in such a manner as mentioned above, each of the switching elements 64 and 65 coupled with the reference electrode 53E of the signal input terminal 53 and the reference electrode 54E of the signal input terminal 54, respectively, is in the OFF state and therefore each of the reference electrodes 53E and 54E are not connected with the reference potential point in the audio amplifier 51. Consequently, a noise voltage which arises between the signal input terminal 53 and the audio signal producing apparatus 78 to correspond to the product of a noise current flowing through a reference conductor of a connecting cable 86 connecting the signal input terminal 53 with the output terminal 79 of the audio signal producing apparatus 78 and an impedance Z5 rendered by the reference conductor of the connecting cable 85 has no effect on the audio signal supplied to the signal electrode 52S of the input terminal terminal 52, and similarly a noise voltage which arises between the signal input terminal 54 and the audio signal producing apparatus 81 to correspond to the product of a noise current flowing through a reference conductor of a connecting cable 87 and an impedance Z6 rendered by the reference conductor of the connecting cable 87 has no effect on the audio signal supplied to the signal electrode 52S of the signal input terminal 52.

In the case where the audio signal obtained from the signal supplying block 80 contained in the audio signal producing apparatus 78 which is connected with the signal input terminal 53 in the audio amplifier 51 is selected to be supplied to the signal processing block 62 contained in the audio amplifier 51, first, under a condition in which each of the control signals S1 to S5 from the control unit 100 is caused to have the low level L so that each of the switching elements 55 to 57, 61, 63 to 68 and 90 is kept in the OFF state and the control voltage ET from the control unit 100 is caused to have the low level VL so that the NPN type transistor 92 is also kept in the OFF state, only the control signal S2 is changed to have the high level H so that each of the switching elements 56, 64 and 67 constituting the relay RL2 is turned on. Then, the control signal S4 from the control unit 100 is changed to have the high level H so that the switching element 90 is turned on and the control voltage ET is changed to have the high level VH so that the NPN type transistor 92 is turned on. Thereby, a current from the current supplying portion 91 flows through the connecting point P3 and the switching elements 90, 67 and 64 to the reference potential point in the audio amplifier 51 and the voltage VI having its level corresponding to an impedance of a series connection of the switching elements 90, 67 and 64 obtained at the connecting point P3. The voltage VI is supplied through the resistor 94 to the control unit 100 and the level of the voltage VI is detected by the control unit 100. The level of the voltage VI is less than the predetermined relatively low level VO when each of the switching elements 90, 67 and 64 has the very low impedance and equal to or more than the predetermined relatively low level VO when at least one of the switching elements 90, 67 and 64 has a relatively high impedance.

When the level of the voltage VI obtained at the connecting point P3 is less than the predetermined relatively low level VO, that is, the switching element 64 provides a very low impedance between the reference electrode 53E of the signal input terminal 53 and the reference potential point in the audio amplifier 51 and therefore the noise voltage which arises between the signal input terminal 53 and the audio signal producing apparatus 78 to correspond to the product of the noise current flowing through the reference conductor of the connecting cable 86 which connects the signal input terminal 53 with the output terminal 79 of the audio signal producing apparatus 78 and the impedance Z5 rendered by the reference conductor of the connecting cable 86 is effectively suppressed to have little effect on the audio signal supplied to the signal electrode 53S of the signal input terminal 53. Accordingly, in such a case, the control voltage ET from the control unit 100 is changed to have the low level VL so that the NPN type transistor 92 is turned off and the control signal S4 from the control unit 100 is changed to have the low level L so that the switching element 90 is turned off. Then, the control signal S5 from the control unit 100 is changed to have the high level H so that the switching element 61 is turned on and therefore the audio signal which is obtained from the signal supplying block 80 contained in the audio signal producing apparatus 78 and supplied through a signal electrode 79S of the output terminal 79 and the connecting cable 86 to the signal electrode 53S of the signal input terminal 53 is further supplied through the switching element 56, the common connecting point P1, the resistor 59, the buffer portion 60 and the switching element 61 to the signal processing block 62 contained in the audio amplifier 51.

On the other hand, when the level of the voltage VI, which is obtained at the connecting point P3 under a condition wherein the current from the current supplying portion 91 flows through the connecting point P3 and the switching elements 90, 67 and 64 to the reference potential point in the audio amplifier 51, is equal to or more than the predetermined relatively low level VO, each of the switching elements 64, 67 and 90 is turned off and turned on successively under a condition in which the current from the current supplying portion 91 is able to flow through the connecting point P3 and the switching elements 90, 67 and 64 to the reference potential point in the audio amplifier 51 and thereby the contact portion of each of the switching elements 64, 67 and 90 is subjected to a self-cleaning operation for removing the insulating material undesirably attached thereto.

On the occasion of such a self-cleaning operation, the control signal S2 from the control unit 100 is changed to have the low level L and then, after a predetermined short period, the control signal S2 is changed again to have the high level H, so that each of the switching elements 56, 64 and 67 is turned off and turned on successively. As a result, if the voltage VI obtained at the connecting point P3 comes to have a level less than the predetermined relatively low level, the control voltage ET from the control unit 100 is changed to have the low level VL and the control signals S4 and S5 from the control unit 100 are changed to have the low level L and the high level H, respectively.

To the contrary, if the voltage VI obtained at the connecting point P3 continues to have the level equal to or more than the predetermined relatively low level VO after the self-cleaning operation, the control signal S4 from the control unit 100 is changed to have the low level L and then immediately changed again to have the high level H. As a result, if the voltage VI obtained at the connecting point P3 comes to have a level less than the predetermined relatively low level VO, the control voltage ET from the control unit 100 is changed to have the low level VL and the control signals S4 and S5 from the control unit 100 are changed to have the low level L and the high level H, respectively, so that the audio signal obtained from the signal supplying block 80 contained in the audio signal producing apparatus 78 connected with the signal input terminal 53 is supplied to the signal processing block 62 contained in the audio amplifier 51.

Further, if the voltage VI obtained at the connecting point P3 continues to have the level equal to or more than the predetermined relatively low level VO after the contact portion of each of the switching elements 56, 64, 67 and 90 has been subjected to the self-cleaning operation carried out as mentioned above, the contact portion of each of the switching elements 56, 64, 67 and 90 is repeatedly subjected to the self-cleaning operation for the purpose of causing the voltage VI at the connecting point P3 to have the level less than the predetermined relatively low level VO. In the case where the voltage VI at the connecting point P3 comes to have the level less than the predetermined relatively low level VO before the self-cleaning operation to the contact portion of each of the switching elements 56, 64, 67 and 90 has been repeated as many as a predetermined number of times, for example, twenty times, the control voltage ET from the control unit 100 is changed to have the low level VL and the control signals S4 and S5 from the control unit 100 are changed to have the low level L and the high level H, respectively, so that the audio signal obtained from the signal supplying block 80 contained in the audio signal producing apparatus 78 connected with the signal input terminal 53 is supplied to the signal processing block 62 contained in the audio amplifier 51.

On the other hand, in the case where the voltage VI at the connecting point P3 continues to have the level equal to or more than the predetermined relatively low level VO after the self-cleaning operation to the contact portion of each switching elements 56, 64, 67 and 90 has been repeated twenty times, it is judged that at least one of the switching elements 64, 67 and 90 is unable to be recovered to have the very low impedance by the self-cleaning operation and therefore the audio signal obtained from the signal supplying block 80 contained in the audio signal producing apparatus 78 connected with the signal input terminal 53 is maintained not to be supplied to the signal processing block 62 contained in the audio amplifier 51.

When the audio signal obtained from the signal supplying block 80 contained in the audio signal producing apparatus 78 connected with the signal input terminal 53 is supplied to the signal processing block 62 contained in the audio amplifier 51 under a condition wherein it is secured that the switching element 64 provides the very low impedance between the reference electrode 53E of the signal input terminal 53 and the reference potential point in the audio amplifier 51 in such a manner as mentioned above, each of the switching elements 63 and 65 coupled with the reference electrode 52E of the signal input terminal 52 and the reference electrode 54E of the signal input terminal 54, respectively, is in the OFF state and therefore each of the reference electrodes 52E and 54E are not connected with the reference potential point in the audio amplifier 51. Consequently, a noise voltage which arises between the signal input terminal 52 and the audio signal producing apparatus 75 to correspond to the product of a noise current flowing through a reference conductor of a connecting cable 85 connecting the signal input terminal 52 with the output terminal 76 of the audio signal producing apparatus 75 and the impedance Z4 rendered by the reference conductor of the connecting cable 85 has no effect on the audio signal supplied to the signal electrode 53S of the input terminal terminal 53, and similarly the noise voltage which arises between the signal input terminal 54 and the audio signal producing apparatus 81 to correspond to the product of a noise current flowing through a reference conductor of a connecting cable 87 and an impedance Z6 rendered by the reference conductor of the connecting cable 87 has no effect on the audio signal supplied to the signal electrode 53S of the signal input terminal 53.

Further, in the case where the audio signal obtained from the signal supplying block 83 contained in the audio signal producing apparatus 81 which is connected with the signal input terminal 54 in the audio amplifier 51 is selected to be supplied to the signal processing block 62 contained in the audio amplifier 51, first, under a condition in which each of the control signals S1 to S5 from the control unit 100 is caused to have the low level L so that each of the switching elements 55 to 57, 61, 63 to 68 and 90 is kept in the OFF state and the control voltage ET from the control unit 100 is caused to have the low level VL so that the NPN type transistor 92 is also kept in the OFF state, only the control signal S3 is changed to have the high level H so that each of the switching elements 57, 65 and 68 constituting the relay RL3 is turned on. Then, the control signal S4 from the control unit 100 is changed to have the high level H so that the switching element 90 is turned on and the control voltage ET is changed to have the high level VH so that the NPN type transistor 92 is turned on. Thereby, a current from the current supplying portion 91 flows through the connecting point P3 and the switching elements 90, 68 and 65 to the reference potential point in the audio amplifier 51 and the voltage VI having its level corresponding to an impedance of a series connection of the switching elements 90, 68 and 65 obtained at the connecting point P3. The voltage VI is supplied through the resistor 94 to the control unit 100 and the level of the voltage VI is detected by the control unit 100. The level of the voltage VI is less than the predetermined relatively low level VO when each of the switching elements 90, 68 and 65 has the very low impedance and equal to or more than the predetermined relatively low level VO when at least one of the switching elements 90, 68 and 65 has a relatively high impedance.

When the level of the voltage VI obtained at the connecting point P3 is less than the predetermined relatively low level VO, that is, the switching element 65 provides a very low impedance between the reference electrode 54E of the signal input terminal 54 and the reference potential point in the audio amplifier 51 and therefore the noise voltage which arises between the signal input terminal 54 and the audio signal producing apparatus 81 to correspond to the product of the noise current flowing through the reference conductor of the connecting cable 87 which connects the signal input terminal 54 with the output terminal 82 of the audio signal producing apparatus 81 and the impedance Z6 rendered by the reference conductor of the connecting cable 87 is effectively suppressed to have little effect on the audio signal supplied to the signal electrode 54S of the signal input terminal 54. Accordingly, in such a case, the control voltage ET from the control unit 100 is changed to have the low level VL so that the NPN type transistor 92 is turned off and the control signal S4 from the control unit 100 is changed to have the low level L so that the switching element 90 is turned off. Then, the control signal S5 from the control unit 100 is changed to have the high level H so that the switching element 61 is turned on and therefore the audio signal which is obtained from the signal supplying block 83 contained in the audio signal producing apparatus 81 and supplied through a signal electrode 82S of the output terminal 82 and the connecting cable 87 to the signal electrode 54S of the signal input terminal 54 is further supplied through the switching element 57, the common connecting point P1, the resistor 59, the buffer portion 60 and the switching element 61 to the signal processing block 62 contained in the audio amplifier 51.

On the other hand, when the level of the voltage VI, which is obtained at the connecting point P3 under a condition wherein the current from the current supplying portion 91 flows through the connecting point P3 and the switching elements 90, 68 and 65 to the reference potential point in the audio amplifier 51, is equal to or more than the predetermined relatively low level VO, each of the switching elements 65, 68 and 90 is turned off and turned on successively under a condition in which the current from the current supplying portion 91 is able to flow through the connecting point P3 and the switching elements 90, 68 and 65 to the reference potential point in the audio amplifier 51 and thereby the contact portion of each of the switching elements 65, 68 and 90 is subjected to a self-cleaning operation for removing the insulating material undesirably attached thereto.

On the occasion of such a self-cleaning operation, the control signal S3 from the control unit 100 is changed to have the low level L and then, after a predetermined short period, the control signal S3 is changed again to have the high level H, so that each of the switching elements 57, 65 and 68 is turned off and turned on successively. As a result, if the voltage VI obtained at the connecting point P3 comes to have a level less than the predetermined relatively low level VO, the control voltage ET from the control unit 100 is changed to have the low level VL and the control signals S4 and S5 from the control unit 100 are changed to have the low level L and the high level H, respectively.

To the contrary, if the voltage VI obtained at the connecting point P3 continues to have the level equal to or more than the predetermined relatively low level VO after the self-cleaning operation, the control signal S4 from the control unit 100 is changed to have the low level L and then immediately changed again to have the high level H. As a result, if the voltage VI obtained at the connecting point P3 comes to have a level less than the predetermined relatively low level VO, the control voltage ET from the control unit 100 is changed to have the low level VL and the control signals S4 and S5 from the control unit 100 are changed to have the low level L and the high level H, respectively, so that the audio signal obtained from the signal supplying block 83 contained in the audio signal producing apparatus 81 connected with the signal input terminal 54 is supplied to the signal processing block 62 contained in the audio amplifier 51.

Further, if the voltage VI obtained at the connecting point P3 continues to have the level equal to or more than the predetermined relatively low level VO after the contact portion of each of the switching elements 57, 65, 68 and 90 has been subjected to the self-cleaning operation carried out as mentioned above, the contact portion of each of the switching elements 57, 65, 68 and 90 is repeatedly subjected to the self-cleaning operation for the purpose of causing the voltage VI at the connecting point P3 to have the level less than the predetermined relatively low level VO. In the case where the voltage VI at the connecting point P3 comes to have the level less than the predetermined relatively low level VO before the self-cleaning operation to the contact portion of each of the switching elements 57, 65, 68 and 90 has been repeated as many as a predetermined number of times, for example, twenty times, the control voltage ET from the control unit 100 is changed to have the low level VL and the control signals S4 and S5 from the control unit 100 are changed to have the low level L and the high level H, respectively, so that the audio signal obtained from the signal supplying block 83 contained in the audio signal producing apparatus 81 connected with the signal input terminal 54 is supplied to the signal processing block 62 contained in the audio amplifier 51.

On the other hand, in the case where the voltage VI at the connecting point P3 continues to have the level equal to or more than the predetermined relatively low level VO after the self-cleaning operation to the contact portion of each switching elements 57, 65, 68 and 90 has been repeated twenty times, it is judged that at least one of the switching elements 65, 68 and 90 is unable to be recovered to have the very low impedance by the self-cleaning operation and therefore the audio signal obtained from the signal supplying block 83 contained in the audio signal producing apparatus 81 connected with the signal input terminal 54 is maintained not to be supplied to the signal processing block 62 contained in the audio amplifier 51.

When the audio signal obtained from the signal supplying block 83 contained in the audio signal producing apparatus 81 connected with the signal input terminal 54 is supplied to the signal processing block 62 contained in the audio amplifier 51 under a condition wherein it is secured that the switching element 65 provides the very low impedance between the reference electrode 54E of the signal input terminal 54 and the reference potential point in the audio amplifier 51 in such a manner as mentioned above, each of the switching elements 63 and 64 coupled with the reference electrode 52E of the signal input terminal 52 and the reference electrode 53E of the signal input terminal 53, respectively, is in the OFF state and therefore each of the reference electrodes 52E and 53E are not connected with the reference potential point in the audio amplifier 51. Consequently, a noise voltage which arises between the signal input terminal 52 and the audio signal producing apparatus 75 to correspond to the product of a noise current flowing through a reference conductor of the connecting cable 85 connecting the signal input terminal 52 with the output terminal 76 of the audio signal producing apparatus 75 and the impedance Z4 rendered by the reference conductor of the connecting cable 85 has no effect on the audio signal supplied to the signal electrode 54S of the input terminal terminal 54, and similarly the noise voltage which arises between the signal input terminal 53 and the audio signal producing apparatus 80 to correspond to the product of a noise current flowing through a reference conductor of a connecting cable 86 and an impedance Z5 rendered by the reference conductor of the connecting cable 86 has no effect on the audio signal supplied to the signal electrode 54S of the signal input terminal 54.

The control unit 100 in the second embodiment shown in FIG. 3 is constituted by, for example, a microcomputer and an example of control program carried out by the microcomputer for controlling operations of the relays RL1, RL2 and RL3, the switching elements 61 and 90 and the current supplying portion 91 will be explained below with reference to a flow chart shown in FIG. 4.

Referring to the flow chart shown in FIG. 4, first, in step 101, each of the control signals S1 to S5 is caused to have the low level L and the control voltage ET is caused to have the low level VL. Then, the control signal S1, S2 or S3 is changed to have the high level H in step 102, the control signal S4 is changed to have the high level H in step 103 and the control voltage ET is changed to have the high level VH in step 104.

Next, in step 105, it is checked whether the level of the voltage VI obtained at the connecting point P3 is less than the predetermined relatively low level VO or not. If the level of the voltage VI is less than the predetermined relatively low level VO, the control voltage ET is changed to have the low level VL in step 106, the control signal S4 is changed to have the low level L in step 107 and the control signal S5 is changed to have the high level H in step 108, then the program is finished.

When it is clarified in the step 105 that the level of the voltage VI obtained at the connecting point P3 is equal to or more than the predetermined relatively low level V0, the control signal S1 is changed to have the low level L, in step 109, and a timer contained in the control unit 100 is started measuring operation, in step 110. Then, it is checked whether a time T measured by the timer has reached a predetermined relatively short time T0 or not, in step 111. If the time T has not reached yet the predetermined relatively short time T0, the check in the step 111 is repeated.

When it is clarified in the step 111 that the time T has reached the predetermined relatively short time T0, the timer is stopped operating in step 112 and the control signal S1 is changed to have the high level H in step 113. Then, it is checked whether the level of the voltage VI obtained at the connecting point P3 is less than the predetermined relatively low level V0 or not, in step 114. If the level of the voltage VI is less than the predetermined relatively low level V0, it is checked whether a counted value C of a counter contained in the control unit 100 is zero or not, in step 115. If the counted value C is not zero, the counted value C is reset to be zero in step 116 and the process advances to the step 106. On the other hand, if the counted value C is zero, the process advances directly to the step 106. Then, the steps following the step 106 are carried out successively.

If it is clarified in the step 114 that the level of the voltage VI is equal to and more than the predetermined relatively low level V0, the control signal S4 is changed to have the low level L in step 117 and the timer is started measuring operation in step 118. After that, it is checked whether the time T measured by the timer has reached the predetermined relatively short time T0 or not, in step 119. If the time T has not reached yet the predetermined relatively short time T0, the check in the step 119 is repeated.

When it is clarified in the step 119 that the time T has reached the predetermined relatively short time T0, the timer is stopped operating in step 120 and the control signal S4 is changed to have the high level H in step 121. Then, it is checked whether the level of the voltage VI obtained at the connecting point P3 is less than the predetermined relatively low level V0 or not, in step 122. If the level of the voltage VI is less than the predetermined relatively low level V0, the process advances to the step 115, and the step 115 and the steps following the step 115 are carried out successively.

On the other hand, when it is clarified in the step 122 that the level of the voltage VI is equal to or more than the predetermined relatively low level V0, the counted value C of the counter is increased by "1", in step 123 and then it is checked whether the counted value C of the counter has reached a predetermined value CR, for example, "20", or not, in step 124. If the counted value C has not reached yet the predetermined value CR not zero, the process returns to the step 109, and the step 109 and the steps following the step 109 are carried out successively. If the counted value C has reached the predetermined value CR, the counted value C is reset to be zero in step 125 and the control voltage ET is changed to have the low level VL in step 126. Then, the control signal S4 is changed to have the low level L in step 127 and the control signal S1, S2 or S3 is changed to have the low level L, in step 128, then the program is finished.

Although three signal input terminals 52, 53 and 54 are provided in the second embodiment shown in FIG. 3, it is to be understood that the number of the signal input terminals is not limited to be three but two or more than three signal input terminals can be provided in the signal input selecting circuit according to the present invention.

What is claimed is:

1. A signal input selecting circuit comprising:
   a plurality of signal input terminals each comprising a signal electrode and a reference electrode,
   first switch means for selecting one of the signal electrodes of the signal input terminals to be connected with a signal processing block,
   second switch means for selecting one of the reference electrodes of the signal input terminals to be connected with a reference potential point,
   third switch means for connecting the second switch means with a current supplying portion, and
   voltage detecting means for detecting a voltage corresponding to an impedance of the second switch means,
   wherein when the voltage detected by said voltage detecting means has a level thereof less than a predetermined level under a condition in which said second switch means is in operation to connect the reference electrode of a selected one of the signal input terminals with the reference potential point and said third switch means is in operation to connect said second switch means with the current supplying portion, said third switch means is turned to disconnect said second switch means from the current supplying portion and said first switch means is caused to connect the signal electrode of the selected one of the signal input terminals with the signal processing block.

2. A signal input selecting circuit according to claim 1, wherein said first switch means comprises a plurality of first switching elements disposed between corresponding ones of the signal electrodes of the signal input terminals and the signal processing block, said second switch means comprises a plurality of second switching elements disposed between corresponding one of the reference electrodes of the signal input terminals and the reference potential point, and said third switch means comprises a plurality of third switching elements disposed between corresponding ones of the reference electrodes of the signal input terminals and the current supplying portion.

3. A signal input selecting circuit according to claim 2, wherein said first switch means further comprises an additional switching element disposed between each of said first switching elements and the signal processing block.

4. A signal input selecting circuit according to claim 2 further comprising a buffer portion connected between each of said first switching elements and the signal processing means.

5. A signal input selecting circuit according to claim 2, wherein said first, second and third switching elements constitute a plurality of relay devices each comprising one of said first switching elements, one of said second switching elements and one of said third switching elements each connected with the same signal input terminal.

6. A signal input selecting circuit according to claim 1, wherein said voltage detecting means is operative to detect the voltage corresponding to the impedance of said second switch means under the condition in which said second switch means is in operation to connect the reference electrode of the selected one of the signal input terminals with the reference potential point and said third switch means is in operation to connect said second switch means with the current supplying portion.

7. A signal input selecting circuit according to claim 1 further comprising switch control means operative to cause said second switch means which is in operation to connect the reference electrode of the selected signal input terminal with the reference potential point to disconnect said reference electrode with the reference potential point for a predetermined short period and thereafter to connect again said reference electrode to the reference potential point, so that a contact portion of said second switch means is subjected to self-cleaning operation to reduce the impedance thereof, when the voltage detected by said voltage detecting means has a level thereof equal to or more than the predetermined level.

8. A signal input selecting circuit according to claim 7, wherein said switch control means is operative to control further operations of said first and third switch means.

9. A signal input selecting circuit according to claim 8, wherein said first switch means comprises a plurality of first switching elements disposed between corresponding ones of the signal electrodes of the signal input terminals and the signal processing block, said second switch means comprises a plurality of second switching elements disposed between corresponding one of the reference electrodes of the signal input terminals and the reference potential point, and said third switch means comprises a plurality of third switching elements disposed between corresponding ones of the reference electrodes of the signal input terminals and the current supplying portion.

10. A signal input selecting circuit according to claim 9, wherein said first switch means further comprises an additional switching element disposed between each of said first switching elements and the signal processing block.

* * * * *